(12) United States Patent
Lin et al.

(10) Patent No.: US 6,812,763 B1
(45) Date of Patent: Nov. 2, 2004

(54) AUTOMATIC WIDEBAND QUADRATURE FREQUENCY GENERATOR

(75) Inventors: Hung C. Lin, Silver Spring, MD (US); Chiang H. Yeh, Gaithersburg, MD (US)

(73) Assignee: Marylabd Semiconductor, Inc., Clarksburg, MD (US)

( * ) Notice: Subject to any disclaimer, the term of this patent is extended or adjusted under 35 U.S.C. 154(b) by 25 days.

(21) Appl. No.: 10/608,303

(22) Filed: Jun. 30, 2003

(51) Int. Cl.$^7$ .............................................. H03H 11/16
(52) U.S. Cl. ...................... 327/254; 327/238; 327/357
(58) Field of Search ................................. 327/238, 242, 327/246, 254, 255, 355–359, 113, 116, 119; 455/326, 333

(56) References Cited

U.S. PATENT DOCUMENTS

| | | | | |
|---|---|---|---|---|
| 5,495,194 A | * | 2/1996 | Sugawara | 327/113 |
| 5,625,307 A | * | 4/1997 | Scheinberg | 327/113 |
| 5,659,263 A | * | 8/1997 | Dow et al. | 327/356 |
| 6,094,571 A | * | 7/2000 | Groe | 455/333 |
| 6,369,633 B1 | * | 4/2002 | Tsukahara | 327/254 |
| 6,564,045 B1 | * | 5/2003 | Fransis | 455/318 |

* cited by examiner

*Primary Examiner*—Minh Nguyen (57) ABSTRACT

When two sine-wave signals in quadrature, the integral of the output is equal to zero. Conversely, when an in-phase signal is inputted as one multiplicand and the output is set to zero, a quadrature signal is derived from the second multiplicand automatically. Any analog multiplier can be used. Examples using differential pair and conductance multiplier have been demonstrated. The multiplier operates over a wideband, and the in phase and quadrature signals can be equalized automatically.

15 Claims, 11 Drawing Sheets

AUTOMATIC WIDEBAND QUADRATURE FREQUENCY GENERATOR

BACKGROUND

1. Filed of Invention

This invention relates to communication circuits, particularly to transceiver circuits.

2. Brief Description of Related Art

The generation of a quadrature frequency signal in addition to an in-phase signal is widely used in modem direct frequency conversion (homodyne) circuits. The homodyne circuits increase image rejection and avoid the expensive intermediate frequency bandpass filters (where SAW filers are commonly used). However, the homodyne circuit requires both an in-phase signal and a quadrature phase signal to beat with the incoming radio frequency signal so that the beat frequency output is complete.

Figure 1:
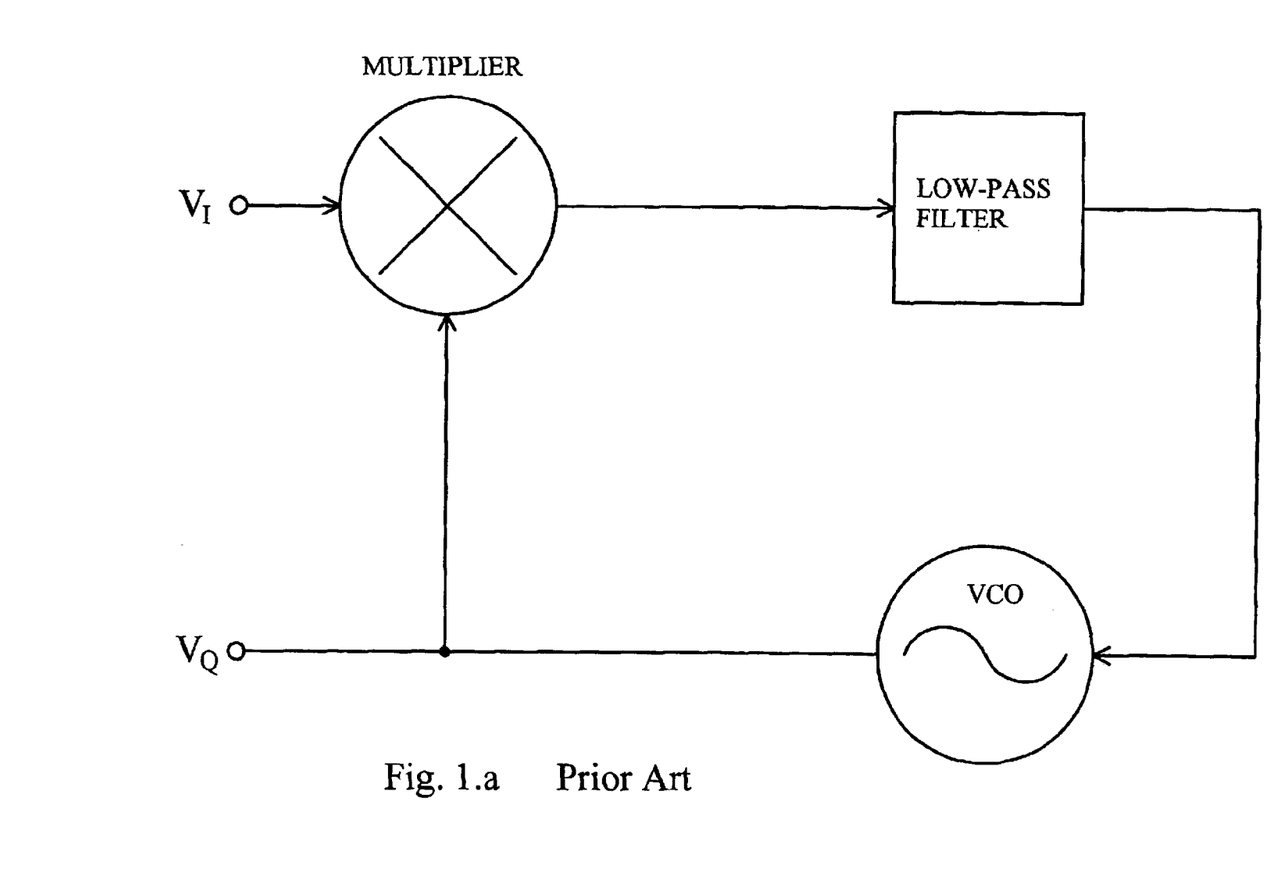
FIG. 1a shows a phase-locked loop to derive a quadrature-phase signal from an in-phase signal using a VCO.
FIG. 1b shows a frequency synthesizer.

In a paper given at the 2003 IASTED Circuit, Signals and System Conference, a paper by Ming-Hao Sun and H. C. Lin, entitled: "Automatic Quadrature Phase Generator" was presented. The circuit is shown in FIG. 1a, where a voltage-controlled oscillator (VCO) is used in phase-locked loop, which includes a phase comparator (PC) which is a multiplier, a low-pass filter (LP). The input signal ($V_I$) to the phase comparator is at quadrature phase with the feedback signal from the VCO and the feedback signal is derived as the quadrature phase signal ($V_Q$). However, in a typical frequency synthesizer, the VCO frequency is divided by a frequency divider to compare with the reference as shown in FIG. 1b. The drawbacks of this circuit in FIG. 1a are: (1) a VCO is required, and (2) the quadrature phase signal $V_Q$ is that of the divided frequency, not the quadrature phase frequency of the VCO, while the desired quadrature phase signal is usually that of the VCO.

SUMMARY

The object of this paper is to generate a quadrature phase signal from an in-phase signal without using a VCO. Another object of this paper is to generate a wideband quadrature phase frequency signal. Still another object is to generate equal amplitude in-phase and quadrature phase signals.

These objects are achieved by using an analog multiplier. One multiplicand is the in-phase input signal $V_I$, and the output of the multiplier is set to zero. Then a quadrature phase signal is derived from the other multiplicand. When a differential pair multiplier is used as the multiplier and $V_I$ is applied to control the current source, a quadrature phase signal appears at the input of the differential pair. The ac output is set to zero by short-circuiting the output directly to the positive power supply. Other kinds of analog multipliers may also be used.

DETAILED DESCRIPTION OF THE MULTIPLER

The basic principle of a multiplier is to multiply two quantities. Let the signals be two signals $V_1 \sin \omega t$ and $V_2 \sin(\omega t+\phi)$. When the two signals are multiplied, the integral of the two signals are as follows:

$$\int [V_1 \sin \omega t][V_2 \sin(\omega t+\phi)] d(\omega t)=0 \text{ when } \omega=\pm 90° \quad (1)$$

Figure 2:
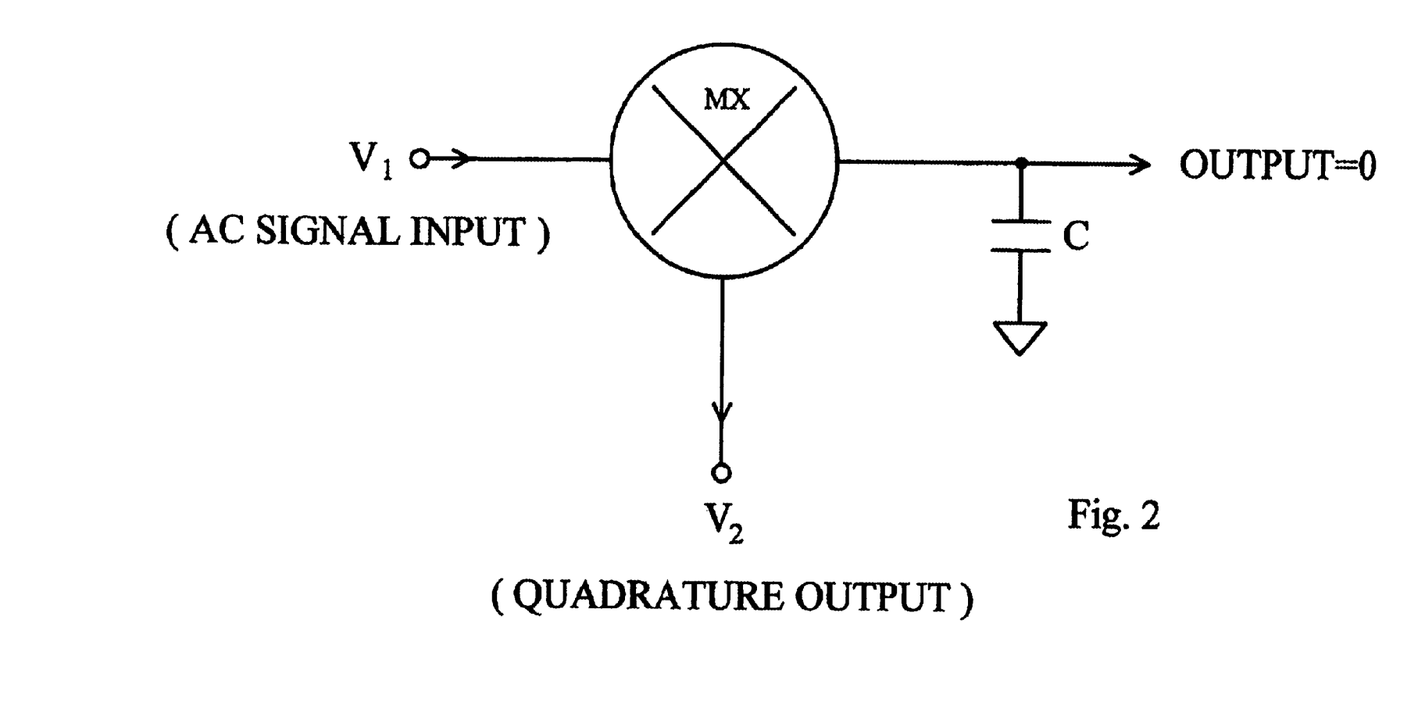
FIG. 2 shows an analog multiplier using an in-phase signal a multiplicand, setting the output to be zero, and deriving a quadrature-phase signal from the other multiplicand.

In the multiplier shown in FIG. 2, the two signals are two multiplicands to a multiplier, and the output is set to be zero. When one of the multiplicands is the signal $V_I=V_1 \sin \omega t$, then the other multiplicand $V_Q$ must necessarily be at quadrature. Thus, a quadrature frequency signal is obtained.

Figure 3:
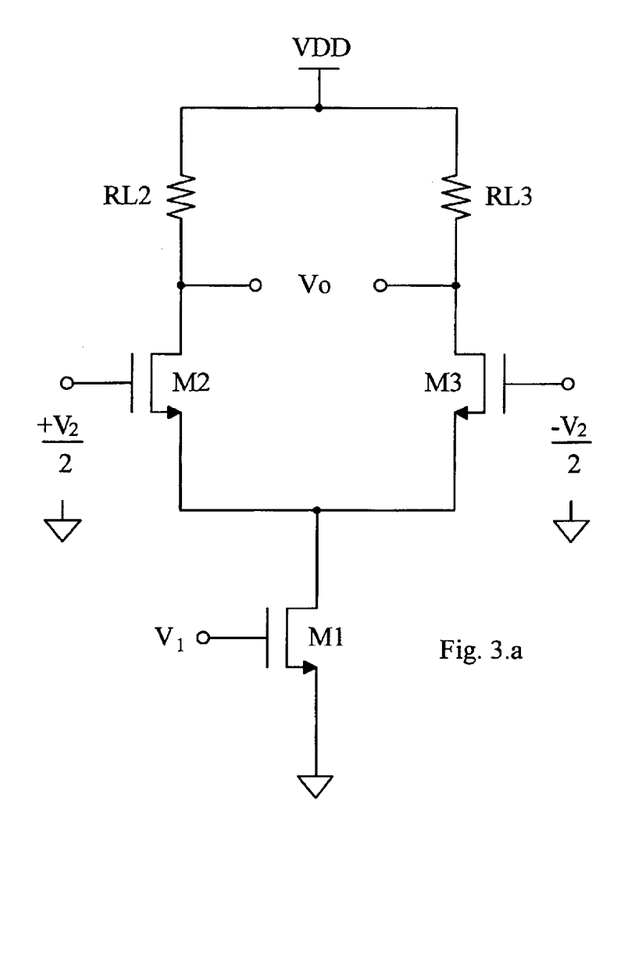
FIG. 3a shows an NMOS differential pair as a multiplier.
FIG. 3b shows short-circuiting the output of the differential pair with a capacitor.
FIG. 3c shows single-ended input to the one side of differential pair.
FIG. 3d shows short-circuiting the output of the differential pair to the supply voltage.
FIG. 3e shows a differential pair multiplier including dc biasing elements.

There are many ways to implement a multiplier. A commonly-used multiplifier is a differential pair as shown in FIG. 3a. In this circuit, the dc biasing circuit components are not shown for clarity. The operation of this MOS differential pair is well-known. The differential pair M2, M3 is fed from a current source M1, and the differential output Vo developed across the load resistors RL2 and RL3 appears between the drains of M2 and M3. In this multiplier, the output voltage is proportional to the product of the two input voltages $V_2/2$ and $-V_2/2$. As shown in equation (1), the output voltage Vo is zero when $V_1=V_I$ and $V_2=V_Q$ are at quadrature. The output voltage Vo can be set to zero by short-circuiting with a capacitor Co as shown in FIG. 3b. For single-ended quadrature output signal, one of the gates of the differential pair can be ac grounded as shown in FIG. 3c for 90° phase shift.

When the output in FIG. 3c is ac shorted and grounded, the ac potential of the shorted output is the same as that of the supply voltage. Then, the load resistors and Co can be eliminated as shown in FIG. 3d.

FIG. 3e shows the quadrature circuit corresponding to FIG. 3c with dc biasing components. All the NMOS FETs should operate in current saturation (active) region of the drain V-I characteristics. When the gates of M2, M3 are biased through resistors R2, R2' and R3, R3' respectively, the drains are at the higher dc potential than the gates to insure the FETS are operating in the current saturation region. Similarly, when the drain of M1 is equal to the dc gate voltage of the M1, M1 is also operating in the active region, and equal to the source voltage of M2, M3. The source voltage of M2, M3 is at least one threshold voltage below their dc gate voltage. Thus the required $V_{DD}$ should be a little more than two threshold voltage drop to insure both M1, M2 and M3 are operating current saturation regions. M1 is a current mirror of M4, which biases the gate of M1 through a high resistance R1. The resistor R4 controls the dc current of M1. The $V_I$ is coupled to the gate of M1 through a coupling capacitor C1. The gate of M2 outputs the quadrature voltage $V_Q$ through a capacitor C2, and the gate of M3 is ac grounded through a capacitor C3.

It is desirable to equalize the quadrature voltage $V_Q$ with the in-phase voltage $V_I$, i.e. the transconductance of M2 should equal to that of M1. Since the drain current of M1 is double that of M2, the width-to-length ratio of M2 should be double that of M1.

Figure 4:
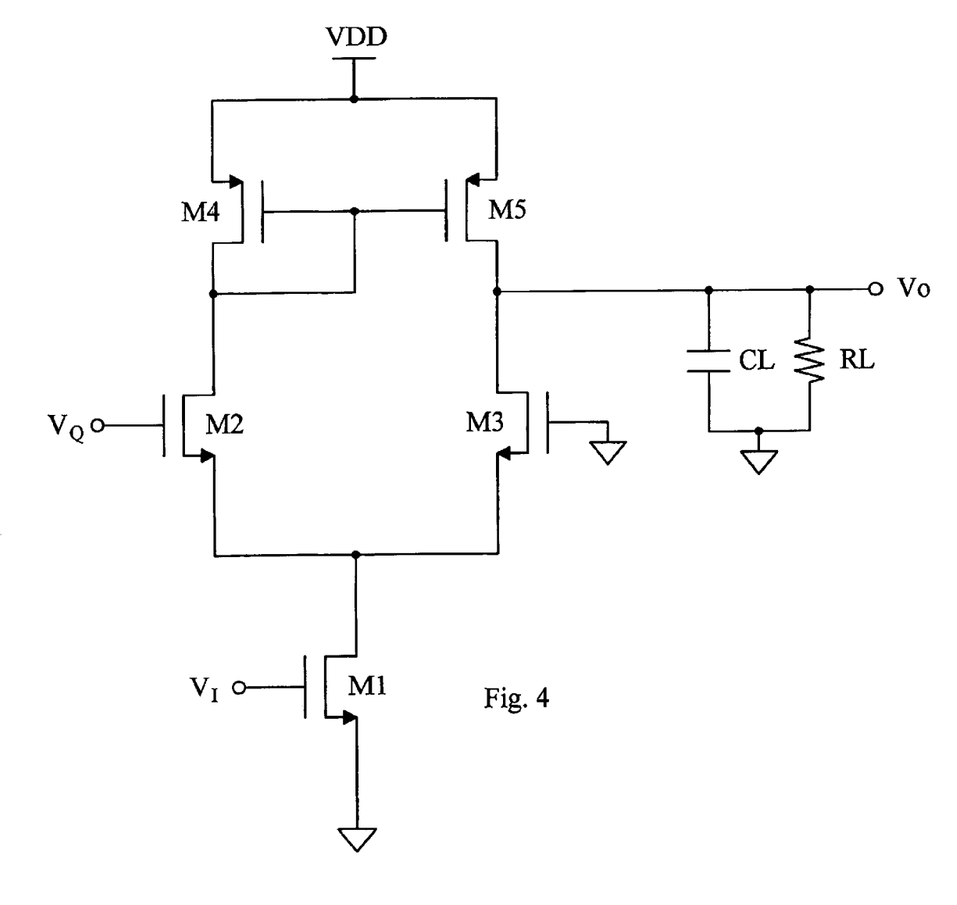
FIG. 4 shows a CMOS differential pair analog multiplier as a quadrature-phase frequency generator.

FIG. 4 shows CMOS differential pair used as an analog multiplier. The load for the differential pair is a PMOS current mirror M4, M5. The output at the common drains of M3 and M5 is single-ended and is clamped to a dc voltage through a load resistance $R_L$, which is ac shorted by capacitor $C_L$ to set the ac output voltage to zero. Similar to FIG. 3c, the ac voltage $V_Q$ appearing at the gate of M2 is at quadrature phase with the ac input voltage $V_I$ applied to the current source M1. The biasing circuit for the current source is similar to that in FIG. 3c.

Figure 5:
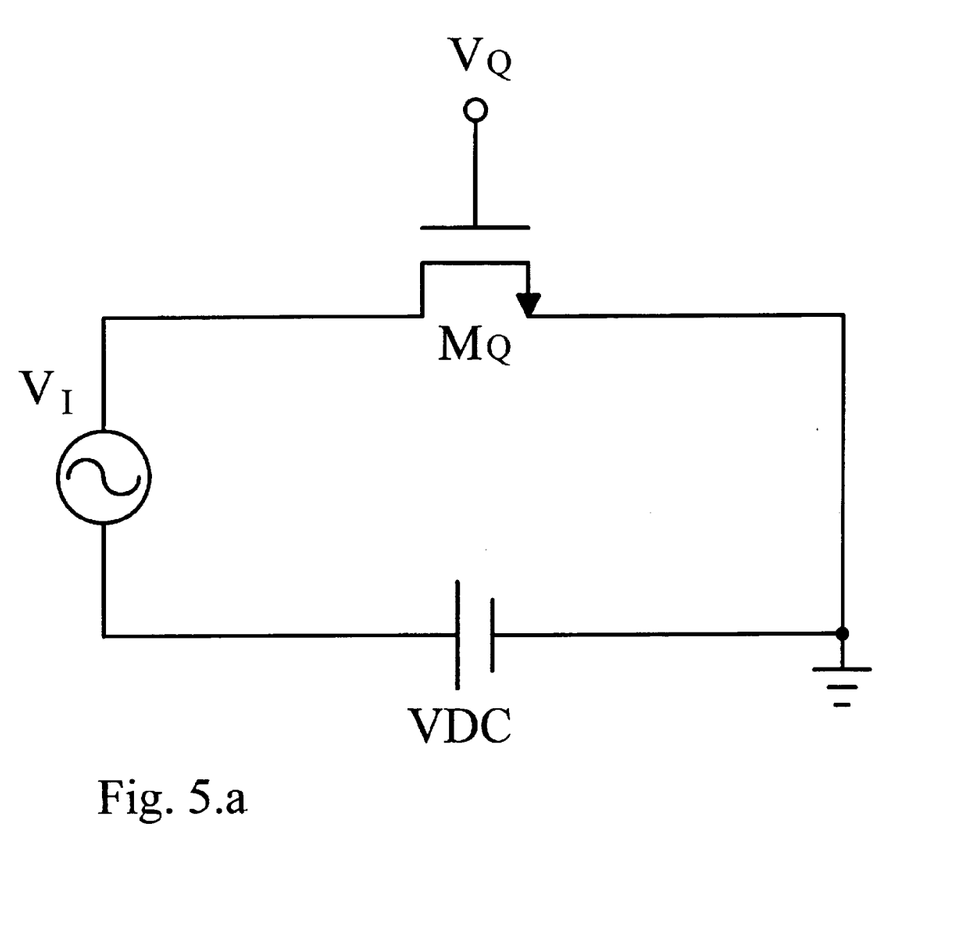
FIG. 5a shows a basic conductance multiplier for quadrature frequency generation.
FIG. 5b shows a circuit to implement the conductance multiplier.

FIG. 5a shows a conductance multiplier. A voltage $V_I$ is applied across an NMOS $M_Q$ operating in the ohmic region of the drain V-I characteristic. The dc drain current $I_{DQ}$ is equal to:

$$I_{DQ}=K_Q(V_{GSQ}-Vt)V_{DSQ} \quad (2)$$

where $K_Q$ is the transconductance parameter, $V_{GSQ}$ is the dc gate-to-source voltage and Vt is the threshold voltage; and the on-conductance is equal to $$g_{on}=K_Q(V_{GSQ}-Vt) \quad (3)$$

When ac signal $V_I$ is superimposed at the non-inverting input of the Op, and a quadrature ac voltage $V_Q$ appears at the gate of $M_Q$. Amp biased at a dc bias of $V_{Io+}$, the current is:

$$I_Q=(V_{Io+}+V_I)K_Q(V_{GSQ}+V_Q-Vt) \quad (4)$$

$$=K_Q[V_{Io+}(V_{GSQ}-Vt)+V_I(V_{GSQ}-Vt)+V_QV_{Io+}V_IV_Q] \quad (5)$$

Thus, there is a product term $V_IV_Q$ in the ac current. The ac current is often converted into an output voltage with an operational amplifier with a feedback resistance. When ac current is zero, the product output voltage is zero and equal to the virtual ground voltage at the input of the operational amplifier. The situation is equivalent to grounding the source of $M_Q$. When the ac current is set to zero, the product $V_IV_Q$ must be in quadrature as shown in Eq.(1).

The sum of the other two ac components must also be equal to zero.

$$V_I(V_{GSQ}-Vt)+V_QV_{Io+}=0 \quad (6)$$

Then, $$V_Q/V_I=-(V_{GSQ}-Vt)/V_{Io+} \quad (7)$$

which can be set equal to unity.

FIG. 5b shows the implementation of FIG. 5a with an operational amplifier. The output of the operational amplifier is shorted to the non-inverting gate of M3 to serve as a voltage follower, and to feed $M_Q$ for conductance multiplication. To insure $M_Q$ operating in the ohmic region, the gate is biased to a voltage $V_{GSQ}$ larger than 2Vt, e.g. $V_{DD}$.

From the foregoing examples, it can be seen quadrature frequency can be generated from an analog multiplier over wideband. The in-phase signal $V_I$ and the quadrature signal $V_Q$ can be automatically set equal. The forgoing multipliers are examples and by no means exhaustive. Other kind of multipliers may also be used to serve the same purpose.

While the preferred embodiments of the invention have been described, it will be apparent to those skilled in the art that various modifications can be made in the embodiments without departing from the spirit of the present invention. Such modifications are all within the scope of this invention.

What is claimed is:

1. A quadrature frequency generator, comprising:
    a single-stage analog multiplier having a first input terminal, a second input terminal and an output terminal for producing an output equal to the product of the signals appearing at said first input terminal and said second input terminal;
    a first ac signal applied to said first input terminal;
    an ac short-circuit connected to the output terminal for ac shorting the output, and
    a second ac signal at quadrature with said first ac signal outputted from said second input terminal.

2. The quadrature frequency generator as described in claim 1, wherein said first ac signal is an in-phase voltage, and said second ac signal is a quadrature voltage.

3. The quadrature frequency generator as described in claim 2, wherein said single-stage analog multiplier is a differential multiplier, having:
    a differential pair fed from a current source, which is controlled by said in-phase voltage,
    said output terminal is the differential output of the differential pair; and
    said second ac voltage is outputted from the differential input of the differential pair.

4. The quadrature frequency generator as described in claim 3, wherein said differential input is single-ended.

5. The quadrature frequency generator as described in claim 3, wherein a capacitor is connected between said differential output to ac short-circuit said differential output.

6. The quadrature frequency generator as described in claim 3, wherein said differential output is short-circuited to a supply voltage at ac ground.

7. The quadrature frequency generator as described in claim 3, wherein the transconductance of said current source is equal to one half of the transconductance of one of the differential pair, so that the amplitude of the quadrature ac voltage is equalized to the in-phase voltage.

8. The quadrature frequency generator as described in claim 3, wherein said differential output is single-ended.

9. The quadrature frequency generator as described in claim 8, wherein a capacitor is connected between said single-ended output and ac ground.

10. The quadrature frequency generator as described in claim 9, wherein said single-ended output is connected to a biasing power supply.

11. The quadrature frequency generator as described in claim 2, where in said single-stage analog multiplier is a MOSFET transistor, wherein:
    said in-phase ac signal is applied to the drain of said MOSFET,
    the source is connected to the output terminal,
    said MOSFET is gate biased to the linear region of the drain V-I characteristic, and said quadrature ac voltage is derived from the gate of said MOSFET.

12. The quadrature frequency generator as described in claim 11, wherein said source is connected to ground.

13. The quadrature frequency generator as described in claim 12, wherein the dc voltage at the drain is set equal to the difference between the dc gate-to-source voltage and the threshold voltage.

14. The quadrature frequency generator as described in claim 1, wherein said ac short-circuit is provided with a capacitor.

15. A method of generating a quadrature frequency signal from an in-phase signal, comprising the steps of:
    applying a first ac signal to the first input terminal of a single-stage analog multiplier having a first input terminal, a second input terminal and an output terminal;
    setting the output terminal of said single-stage analog multiplier to ac zero; and
    outputting a second ac signal at quadrature with said first ac signal from a second input terminal of said analog multiplier.

* * * * *